(12) United States Patent
Yabe

(10) Patent No.: US 7,613,032 B2
(45) Date of Patent: Nov. 3, 2009

(54) SEMICONDUCTOR MEMORY DEVICE AND CONTROL METHOD THEREOF

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 12/027,548

(22) Filed: Feb. 7, 2008

(65) Prior Publication Data

US 2008/0192527 A1  Aug. 14, 2008

(30) Foreign Application Priority Data

Feb. 8, 2007  (JP)  ............................. 2007-029398

(51) Int. Cl.
*G11C 11/00* (2006.01)
(52) U.S. Cl. .................... 365/154; 365/189.16; 365/222
(58) Field of Classification Search ................. 365/154, 365/189.16, 222
See application file for complete search history.

(56) References Cited

U.S. PATENT DOCUMENTS

2006/0262628 A1* 11/2006 Nii et al. ..................... 365/226

OTHER PUBLICATIONS

Leland Chang, et al., "Stable SRAM Cell Design for the 32 nm Node and Beyond", 2005 Symposium on VLSI Technology Digest of Technical Papers, 8A-2, Jun. 2005, pp. 129-129.

* cited by examiner

*Primary Examiner*—Hoai V Ho
(74) *Attorney, Agent, or Firm*—Oblon, Spivak, McClelland, Maier & Neustadt, L.L.P.

(57) ABSTRACT

A semiconductor memory device includes a plurality of memory cells each including a first inverter and a second inverter, a first storage node connected to an output terminal of the first inverter and an input terminal of the second inverter, and a second storage node connected to an input terminal of the first inverter and an output terminal of the second inverter, a word line connected to the memory cells, and a plurality of bit lines connected to the memory cells, respectively. Input data is written to a selected memory cell, and data read from a non-selected memory cell is written again to the non-selected memory cell in write operation.

20 Claims, 8 Drawing Sheets

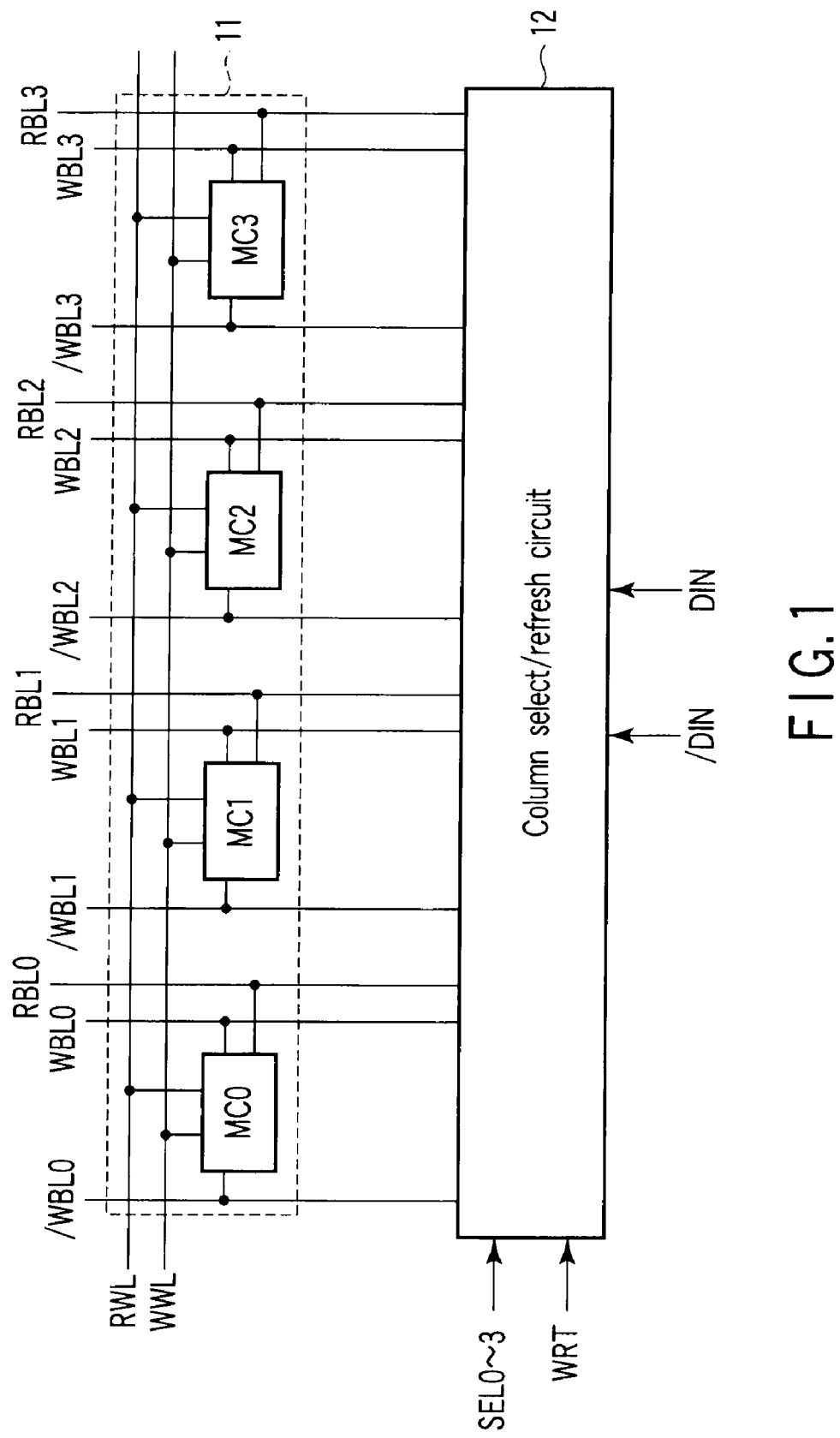
F I G. 1

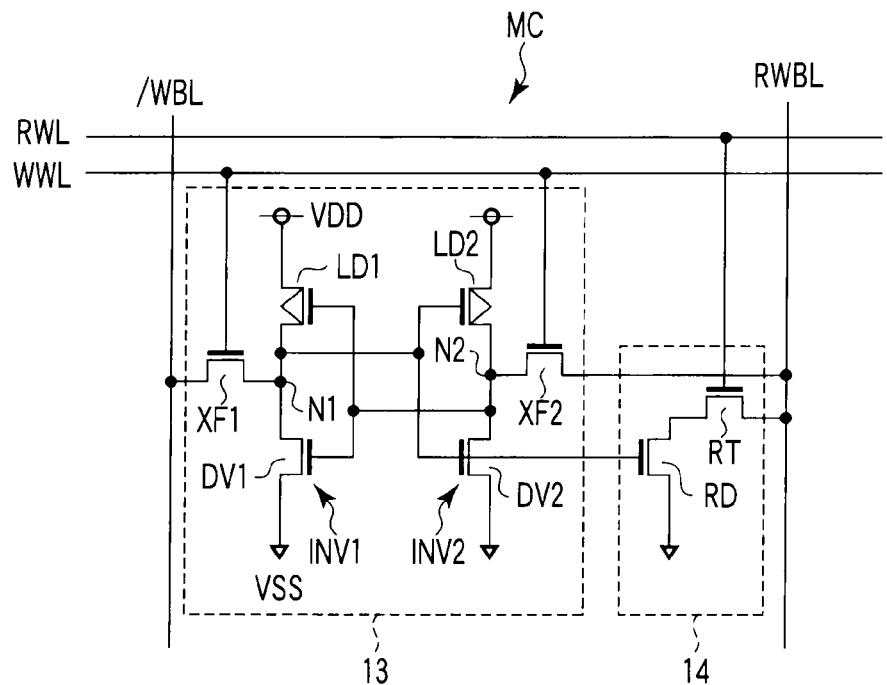
F I G. 7
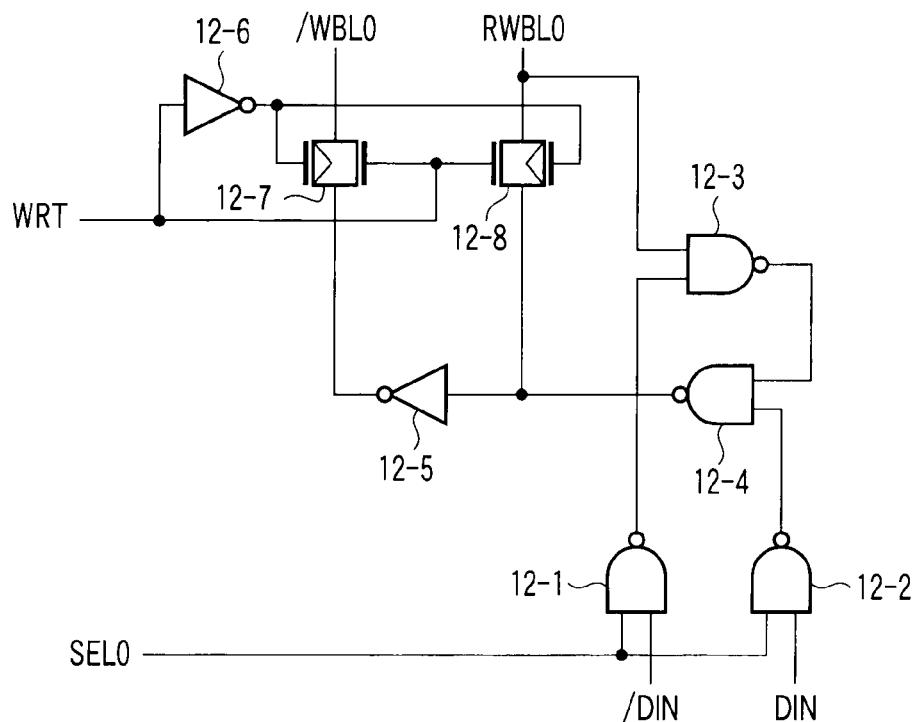
F I G. 8

SEMICONDUCTOR MEMORY DEVICE AND CONTROL METHOD THEREOF

CROSS-REFERENCE TO RELATED APPLICATIONS

This application is based upon and claims the benefit of priority from prior Japanese Patent Application No. 2007-029398, filed Feb. 8, 2007, the entire contents of which are incorporated herein by reference.

BACKGROUND OF THE INVENTION

1. Field of the Invention

The present invention relates to a semiconductor memory device and a control method thereof, for example, a semiconductor memory device including static memory cells and a control method thereof.

2. Description of the Related Art

Static random access memorys (SRAMs) are well known as an example of semiconductor memory devices. SRAM cells (six-transistor SRAM cells) each being formed of six metal oxide semiconductor (MOS) transistors are used as memory cells forming SRAMs.

Each six-transistor SRAM cell has two inverters, and has a structure in which an output terminal of one inverter is connected to an input terminal of the other inverter. Further, each six-transistor SRAM cell has two transfer gates which connect data storage nodes of the inverters to bit lines when data is read and when data is written.

A static noise margin (SNM) is known as an index of an operation margin of an SRAM. The SNM is a value obtained by superposing input/output characteristics of two inverters when a word line is selected and a bit line is precharged to a power supply voltage, and corresponds to a length of a side of a square which is drawn between the curves.

In recent years, the size of transistors used for memory cells has been reduced, to increase the integration of semiconductor memory devices. Further, the threshold voltage of transistors has also been reduced, in correspondence with reduction in power supply voltage. Reduction of these values has caused the problem that variations in threshold voltage of transistors forming memory cells increase. Further, there has been caused the problem that the SNM is reduced by influence of variations in threshold voltage of transistors forming memory cells.

Therefore, in memory cells having low data retention stability due to a low SNM, there is the problem that storing states of the inverter pair storing data are inverted and data is destructed, when data is read from memory cells or a word line connected to memory cells is activated to write data in memory cells.

Further, as a related technique, the following document discloses an SRAM which can increase data retention property by increasing the SNM in data reading.

Document: Leland Chang et al. "Stable SRAM Cell Design for the 32 nm Node and Beyond", 2005 Symposium on VLSI Technology Digest of Technical Papers, pp. 128-129

BRIEF SUMMARY OF THE INVENTION

According to a first aspect of the present invention, there is provided a semiconductor memory device comprising: a plurality of memory cells each including a first inverter and a second inverter, a first storage node connected to an output terminal of the first inverter and an input terminal of the second inverter, and a second storage node connected to an input terminal of the first inverter and an output terminal of the second inverter; a word line connected to the memory cells; and a plurality of bit lines connected to the memory cells, respectively. Input data is written to a selected memory cell, and data read from a non-selected memory cell is written again to the non-selected memory cell in write operation.

According to a second aspect of the present invention, there is provided a control method of a semiconductor memory device, the device comprising:

a plurality of memory cells each including a first inverter and a second inverter, a first storage node connected to an output terminal of the first inverter and an input terminal of the second inverter, and a second storage node connected to an input terminal of the first inverter and an output terminal of the second inverter;

a write word line and a read word line connected to the memory cells; and a plurality of first write bit lines, a plurality of second write bit lines and a plurality of read bit lines connected to the memory cells, respectively, each of the memory cells including:

a first transfer gate which is connected between the first storage node and the corresponding first write bit line, and has a gate connected to the write word line;

a second transfer gate which is connected between the second storage node and the corresponding second write bit line, and has a gate connected to the write word line;

a drive transistor which has a gate connected to the first storage node, and a source connected to a power supply; and a third transfer gate which is connected between a drain of the drive transistor and the corresponding read bit line, and has a gate connected to the read word line, the method comprising:

writing input data to a selected memory cell in write operation; and writing again data stored in a non-selected memory cell to the non-selected memory cell in the write operation.

According to a third aspect of the present invention, there is provided a control method of a semiconductor memory device, the device comprising:

a plurality of memory cells each including a first inverter and a second inverter, a first storage node connected to an output terminal of the first inverter and an input terminal of the second inverter, and a second storage node connected to an input terminal of the first inverter and an output terminal of the second inverter;

a write word line and a read word line connected to the memory cells; and a plurality of first bit lines and a plurality of second bit lines connected to the memory cells, respectively, each of the memory cells including:

a first transfer gate which is connected between the first storage node and the corresponding first bit line, and has a gate connected to the write word line;

a second transfer gate which is connected between the second storage node and the corresponding second bit line, and has a gate connected to the write word line;

a drive transistor which has a gate connected to the first storage node, and a source connected to a power supply; and a third transfer gate which is connected between a drain of the drive transistor and the corresponding second bit line, and has a gate connected to the read word line, the method comprising:

writing input data to a selected memory cell in write operation; and writing again data stored in a non-selected memory cell to the non-selected memory cell in the write operation.

BRIEF DESCRIPTION OF THE SEVERAL VIEWS OF THE DRAWING

FIG. 1 is a block diagram illustrating a structure of an SRAM according to a first embodiment of the present invention.

FIG. 7 is a circuit diagram illustrating a memory cell MC illustrated in FIG. 6.

FIG. 8 is a circuit diagram illustrating a column select/refresh circuit 12 illustrated in FIG. 6.

DETAILED DESCRIPTION OF THE INVENTION

Figure 2:
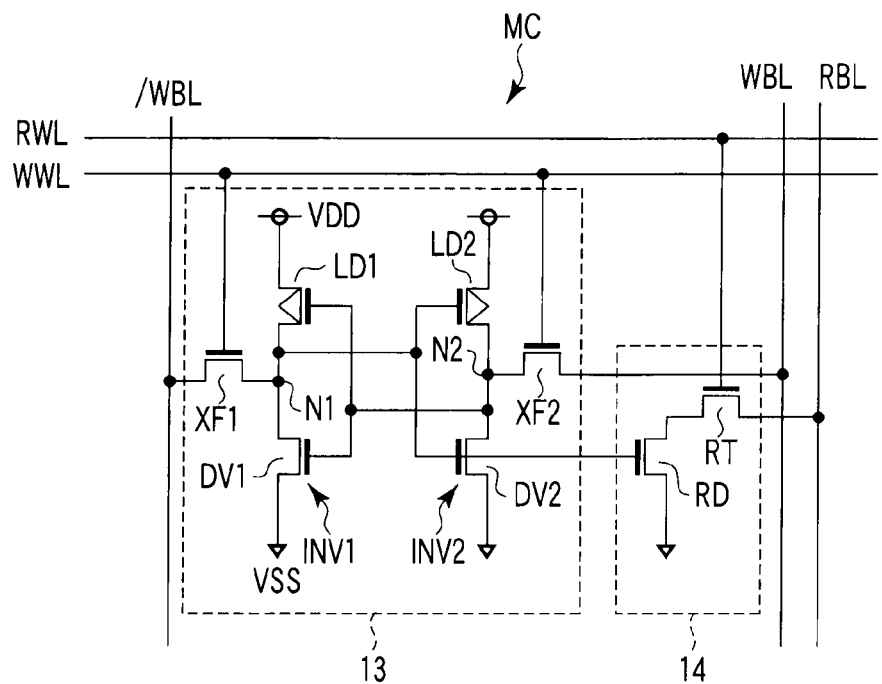
FIG. 2 is a circuit diagram illustrating a memory cell MC illustrated in FIG. 1.

Embodiments of the present invention are described below with reference to drawings. Constituent elements having the same functions and structures in the following explanation are denoted by the same respective reference numerals, and explanation thereof is repeated only when necessary.

FIRST EMBODIMENT

FIG. 1 is a block diagram illustrating a structure of an SRAM according to a first embodiment of the present invention. The SRAM has a memory cell array 11 in which a plurality of static memory cells MC are arranged in a matrix. The memory cell array 11 is provided with a plurality of write word lines WWL each extending in the row direction, and a plurality of read word lines WWL each extending in the row direction. Further, the memory cell array 11 is provided with a plurality of write bit line pairs WBL and /WBL each extending in the column direction, and a plurality of read bit lines RBL each extending in the column direction. The write word lines WWL and the read word lines RWL are selected by a row decoder (not shown).

Although four memory cells MC (MC0 to 3) are illustrated as an example in the first embodiment, actually more memory cells are arranged in a matrix. Further, FIG. 1 illustrates one write word line WWL, one read word line RWL, four write bit line pairs WBL0 to 3 and /WBL0 to 3, and four read bit lines RBL0 to 3, in correspondence with the four memory cells MC0 to 3.

The write bit line pairs WBL and /WBL, and the read bit lines RBL are connected to a column select/refresh circuit 12. The column select/refresh circuit 12 is supplied with a column select signal SEL0 to 3 from a column decoder (not shown), and a write signal WRT from a control circuit (not shown). The write signal WRT is activated (high) when data is written. Further, the column select/refresh circuit 12 is connected to data lines DIN and /DIN, and complementary input data items DIN and /DIN are input to the column select/refresh circuit 12 through the data lines DIN and /DIN from external circuit.

When data is written, the column select/refresh circuit 12 transfers input data items DIN and /DIN to the write bit lines WBL and /WBL of the selected column (the column whose a column select signal SEL is high), and thereby write the input data items DIN and /DIN in the selected memory cell. Further, when data is written, the column select/refresh circuit 12 transfers read data, which is transferred to the read bit lines RBL of non-selected columns (columns whose column select signals SEL are low), to the write bit lines WBL and /WBL of the non-selected columns, and thereby rewrites (refreshes) storage data in the non-selected memory cells.

FIG. 2 is a circuit diagram illustrating a structure of the memory cells MC illustrated in FIG. 1. The memory cells MC are 8Tr. SRAM cells, each being formed of eight MOS transistors.

Each memory cell MC is formed of a data holding section 13, and a reading section 14. The data holding section 13 has inverters INV1 and INV2. The inverter INV1 is formed of a load P-channel MOS (PMOS) transistor LD1, and a drive N-channel MOS (NMOS) transistor DV1. The PMOS transistor LD1 and the NMOS transistor DV1 are connected in series between a power supply terminal, to which a power supply voltage VDD is supplied, and a ground terminal to which a ground voltage VSS is supplied.

The inverter INV2 is formed of a load PMOS transistor LD2 and a drive NMOS transistor DV2. The PMOS transistor LD2 and the NMOS transistor DV2 are connected in series between a power supply terminal and a ground terminal.

Specifically, a source terminal of the PMOS transistor LD1 is connected to the power supply terminal. A drain terminal of the PMOS transistor LD1 is connected to a drain terminal of the NMOS transistor DV1 through a storage node N1. A gate terminal of the PMOS transistor LD1 is connected to a gate terminal of the NMOS transistor DV1. A source terminal of the NMOS transistor DV1 is grounded.

A source terminal of the PMOS transistor LD2 is connected to the power supply terminal. A drain terminal of the PMOS transistor LD2 is connected to a drain terminal of the NMOS transistor DV2 through a storage node N2. A gate terminal of the PMOS transistor LD2 is connected to a gate terminal of the NMOS transistor DV2. A source terminal of the NMOS transistor DV2 is grounded.

The gate terminal of the PMOS transistor LD1 is connected to the storage node N2. The gate terminal of the PMOS transistor LD2 is connected to the storage node N1. In other words, the output terminal of the inverter INV1 is connected to the input terminal of the inverter INV2, and the output terminal of the inverter INV2 is connected to the input terminal of the inverter INV1.

The storage node N1 is connected to the write bit line /WBL through a transfer gate XF1 which is formed of an NMOS transistor. The storage node N2 is connected to the write bit line WBL through a transfer gate XF2 which is formed of an NMOS transistor. Gate terminals of the transfer gates XF1 and XF2 are connected to the write word line WWL.

The reading section 14 is formed of a read drive transistor RD which is formed of an NMOS transistor, and a read transfer gate RT which is formed of an NMOS transistor. A gate terminal of the drive transistor RD is connected to the storage node N1. A source terminal of the drive transistor RD is grounded. A drain terminal of the drive transistor RD is connected to the read bit line RBL through the read transfer gate RT. A gate terminal of the read transfer gate RT is connected to the read word line RWL.

In the memory cell MC structured as described above, when data is read, the read word line RWL is activated (high), and the write word line WWL is kept inactivated (low). Thereby, the read transfer gate RT is turned on, and the potential of the read bit line RBL is changed according to data of the storage node N1.

Specifically, when data "1" is stored in the storage node N1 (data "0" is stored in the storage node N2), the drive transistor RD is turned on, and the read bit line RBL is set to a low-level voltage (data "0" is transferred to the read bit line RBL). This corresponds to processing of reading the data of the storage node N2 to the read bit line RBL.

On the other hand, when data "0" is stored in the storage node N1 (data "1" is stored in the storage node N2), the drive transistor RD is turned off, and the read bit line RBL is kept at high-level voltage. Therefore, the data of the storage node N2 is read to the read bit line RBL.

In the memory cell MC illustrated in FIG. 2, the write word line WWL connected to the transfer gates XF1 and XF2 is not activated when data is read, and thus the potentials of the storage nodes N1 and N2 are not influenced by word line activation. Therefore, the SNM of the memory cell MC is increased, and thus the memory cell MC has an advantage of having high data retention stability.

Figure 3:
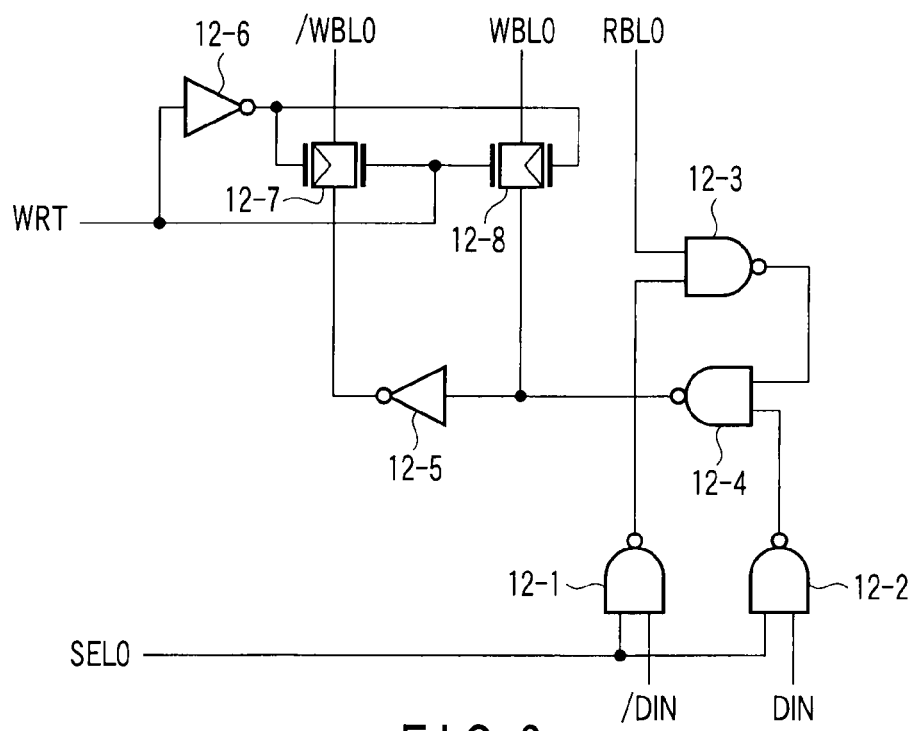
FIG. 3 is a circuit diagram illustrating a column select/refresh circuit 12 illustrated in FIG. 1.

Next, explained is an example of a structure of the column select/refresh circuit 12. FIG. 3 is a circuit diagram of the column select/refresh circuit 12. FIG. 3 illustrates a part of the column select/refresh circuit 12, which corresponds to one column (column 0). The other columns illustrated in the column select/refresh circuit 12 have the same structure as that illustrated in FIG. 3.

The column select/refresh circuit 12 has four NAND gates 12-1 to 12-4, two inverters 12-5 to 12-6, and two transfer gates 12-7 and 12-8. Each of the transfer gates 12-7 and 12-8 is formed by connecting an NMOS transistor and a PMOS transistor in parallel.

The data lines /DIN and DIN are connected to input terminals of the NAND gates 12-1 and 12-2, respectively. The column select signal SEL0 is a column select signal of address 0, and made high when address 0 is selected, and made low when address 0 is not selected. The column select signal SEL 0 is input to the input terminals of the NAN circuits 12-1 and 12-2.

Two input terminals of the NAND gate 12-3 are connected with an output terminal of the NAND gate 12-1 and the read bit line RBL 0. Two input terminals of the NAND gate 12-4 are connected with an output terminal of the NAND gate 12-2 and an output terminal of the NAND gate 12-3.

An output terminal of the NAND gate 12-4 is connected to an input terminal of the inverter 12-5. An output terminal of the inverter 12-5 is connected to the write bit line /WBL0 through the transfer gate 12-7. Further, the output terminal of the NAND gate 12-4 is connected to the write bit line WBL0 through the transfer gate 12-8.

The write signal WRT is made high when data is written to the memory cell MC, and made low in other cases. The write signal WRT and an inversion signal obtained by inverting the write signal WRT by the inverter 12-6 are supplied to the gate electrodes of the transfer gates 12-7 and 12-8. The transfer gates 12-7 and 12-8 are brought into conduction when the write signal WRT is high.

By the column select/refresh circuits 12, the input data items DIN and /DIN are transferred to the write bit line pair WBL and /WBL in the selected column (column whose a column select signal SEL is high). On the other hand, in the non-selected column (column whose a column select signal SEL are low), data read to the read bit line RBL is transferred to the write bit line WBL, and inverted data of the data is transferred to the write bit line /WBL. Specifically, in a non-selected column, data read from any memory cell MC to the read bit line RBL is written again in the memory cell MC.

Figure 4:
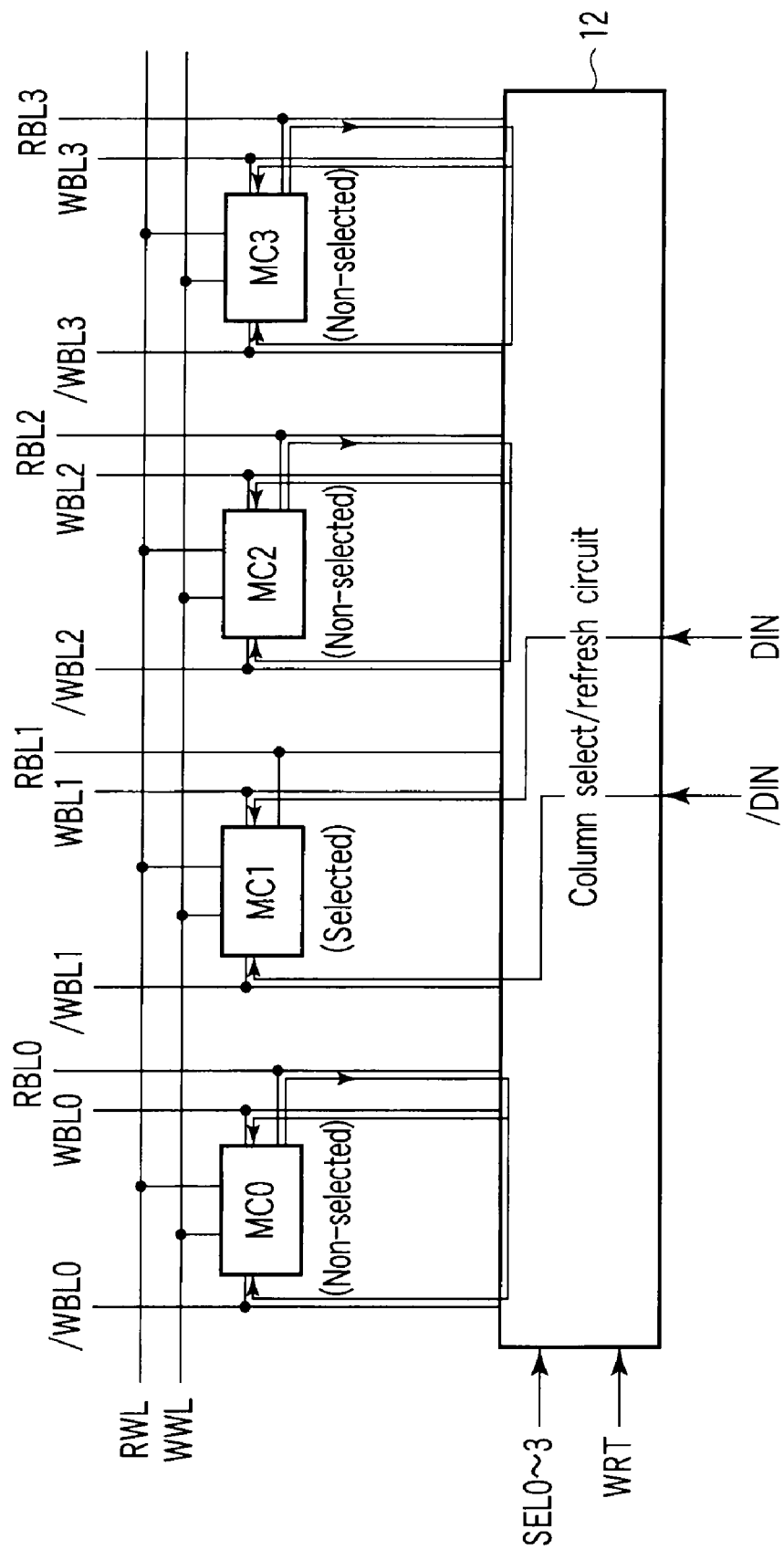
FIG. 4 is a diagram illustrating flow of data when data is written in the first embodiment.
Figure 5:
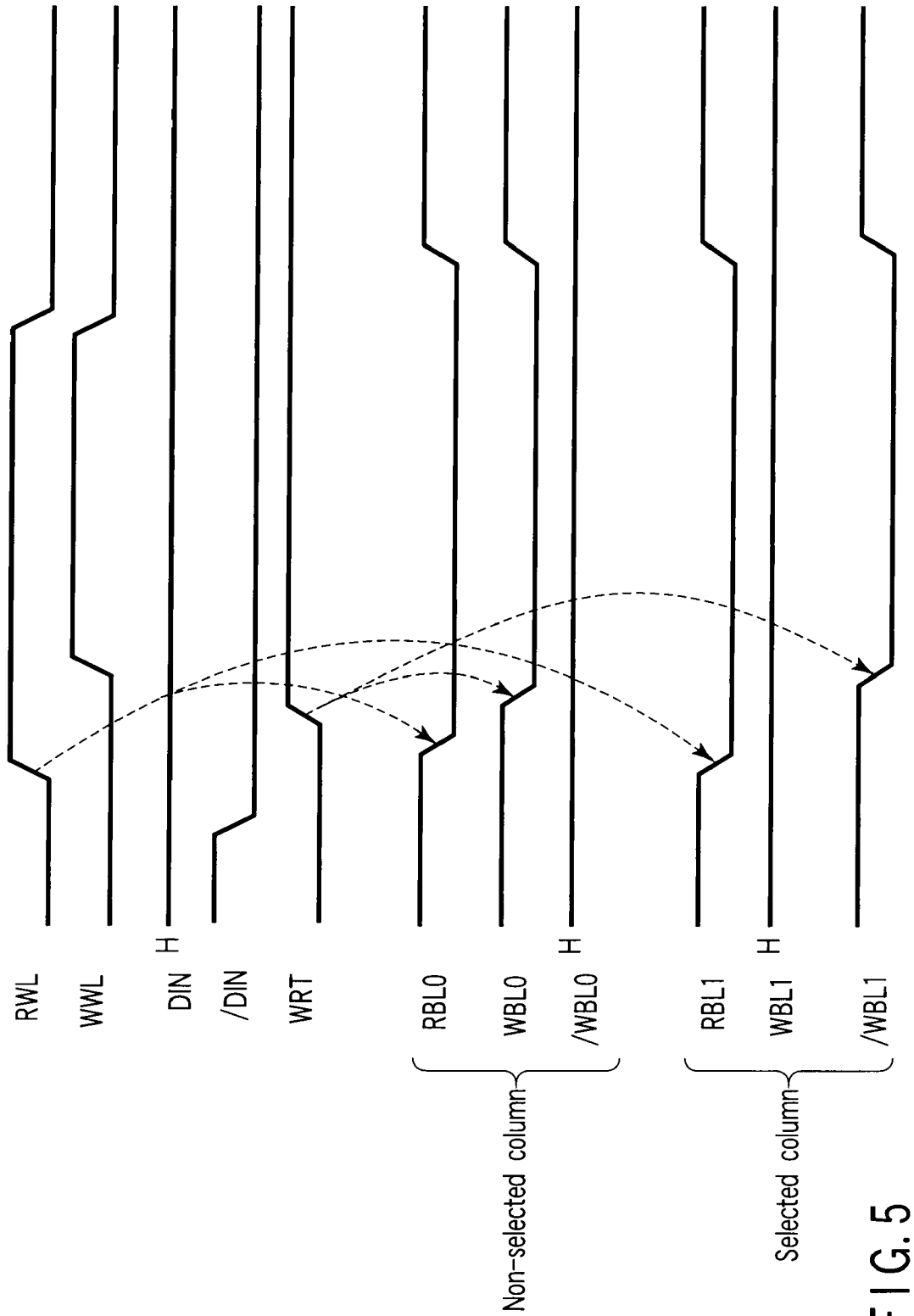
FIG. 5 is a timing chart of the SRAM when data is written in the first embodiment.

The following is an explanation of operation of the SRAM. FIG. 4 is a diagram illustrating flow of data when data is written. FIG. 5 is a timing chart of the SRAM when data is written. As illustrated in FIG. 4, explained is the case where column 1 including the memory cell MC1 is selected, and the other columns (columns 0, 2 and 3) are not selected. FIG. 5 illustrates a timing chart for the selected column (column 1) and a non-selected column (column 0). For example, the input data item DIN is data "1", and the input data item /DIN is data "0". Suppose that data "1" is stored in the storage node N1 of the non-selected memory cell MC0, and data "0" is stored in the storage node N2 of the non-selected memory cell MC0.

In data writing, first, the read word line RWL is made high, and cell data are read to the read bit lines RBL for all of the selected/non-selected columns. Next, the write signal WRT is made high, and input data items DIN and /DIN are transferred to the write bit line pair WBL1 and /WBL1, respectively, of the selected column. On the other hand, the cell data read to the read bit lines RBL are transferred to the write bit line pairs WBL and /WBL of the non-selected columns.

Then, when the write word line WWL is made high, the data of the write bit line pair WBL and /WBL is written to the memory cell MC, in all of the selected/non-selected columns. Specifically, in the selected column, the input data items DIN and /DIN are written to the memory cell MC1. On the other hand, in the non-selected columns, data stored in the memory cells MC are written again.

As described in detail above, according to the first embodiment, when data is written, the read word line RWL is changed to high, and cell data of all the columns are read to the bit lines RBL. Next, the write word line WWL is changed to high, and external input data is written to the selected memory cell, and the cell data read to the read bit lines RBL in advance are written again (refresh) in the non-selected memory cells.

Therefore, according to the first embodiment, it is possible to prevent write disturbance caused by activation of the write word line WWL in data writing. Thereby, reduction in the SNM is not caused in data writing, and it is possible to form SRAMs having high data retention stability.

Further, when data is read, the write word line WWL connected to the gate terminals of the transfer gates XF1 and XF2 is not activated. This prevents reduction in the SNM in data reading.

SECOND EMBODIMENT

The second embodiment has a structure in which the read bit line RBL and the write bit line WBL are combined into a read/write bit line RWBL.

Figure 6:
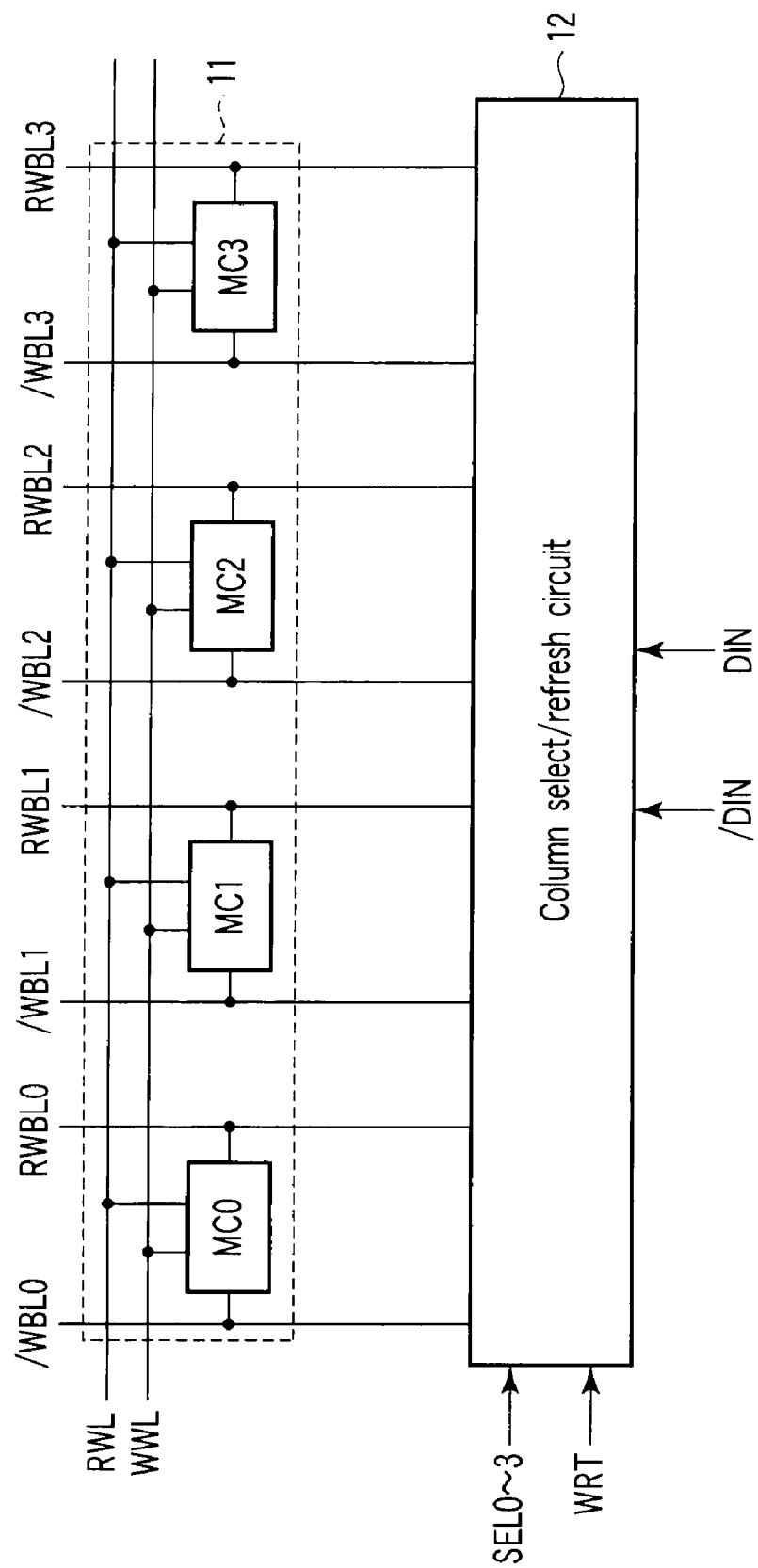
FIG. 6 is a block diagram illustrating a structure of an SRAM according to a second embodiment of the present invention.

FIG. 6 is a block diagram illustrating a structure of an SRAM according to a second embodiment of the present invention. A memory cell array 11 is provided with a plurality of write word lines WWL each extending in the row direction, and a plurality of read word lines RWL each extending in the row direction. Further, the memory cell array 11 is provided with a plurality of write bit lines /WBL each extending in the column direction, and a plurality of read/write bit lines RWBL each extending in the column direction.

In the second embodiment, four memory cells MC (MC0 to 3) are illustrated as an example. Further, FIG. 6 illustrates one write word line WWL, one read word line RWL, four write bit lines /WBL0 to 3, and four read/write bit lines RWBL0 to 3, in correspondence with the four memory cells MC.

FIG. 7 is a circuit diagram illustrating a structure of the memory cells MC illustrated in FIG. 6. A storage node N2 is connected to the read/write bit line RWBL through a transfer gate XF2. Further, a drain terminal of a read drive transistor RD is connected to the read/write bit line RWBL through a read transfer gate RT. The other parts are the same as those of the structure of the memory cell MC illustrated in FIG. 2.

FIG. 8 is a circuit diagram of a column select/refresh circuit 12 illustrated in FIG. 6. FIG. 8 illustrates a part of the column select/refresh circuit 12, which corresponds to one column (column 0). The other columns illustrated in the column select/refresh circuit 12 have the same structure as that illustrated in FIG. 8.

One of input terminals of a NAND gate 12-3 is connected to the read/write bit line RWBL0. An output terminal of a NAND gate 12-4 is connected to the read/write bit line RWBL0 through a transfer gate 12-8. The other parts are the same as those of the structure of the column select/refresh circuit 12 illustrated in the first embodiment.

By the column select/refresh circuit 12 structured as described above, in the selected column, the input data item /DIN is transferred to the write bit line /WBL, and the input data item Din is transferred to the read/write bit line RWBL. On the other hand, in the non-selected columns, data read to the read/write bit lines RWBL are transferred again to the read/write bit lines RWBL, and inverted data of the data are transferred to the write bit lines /WBL.

Figure 9:
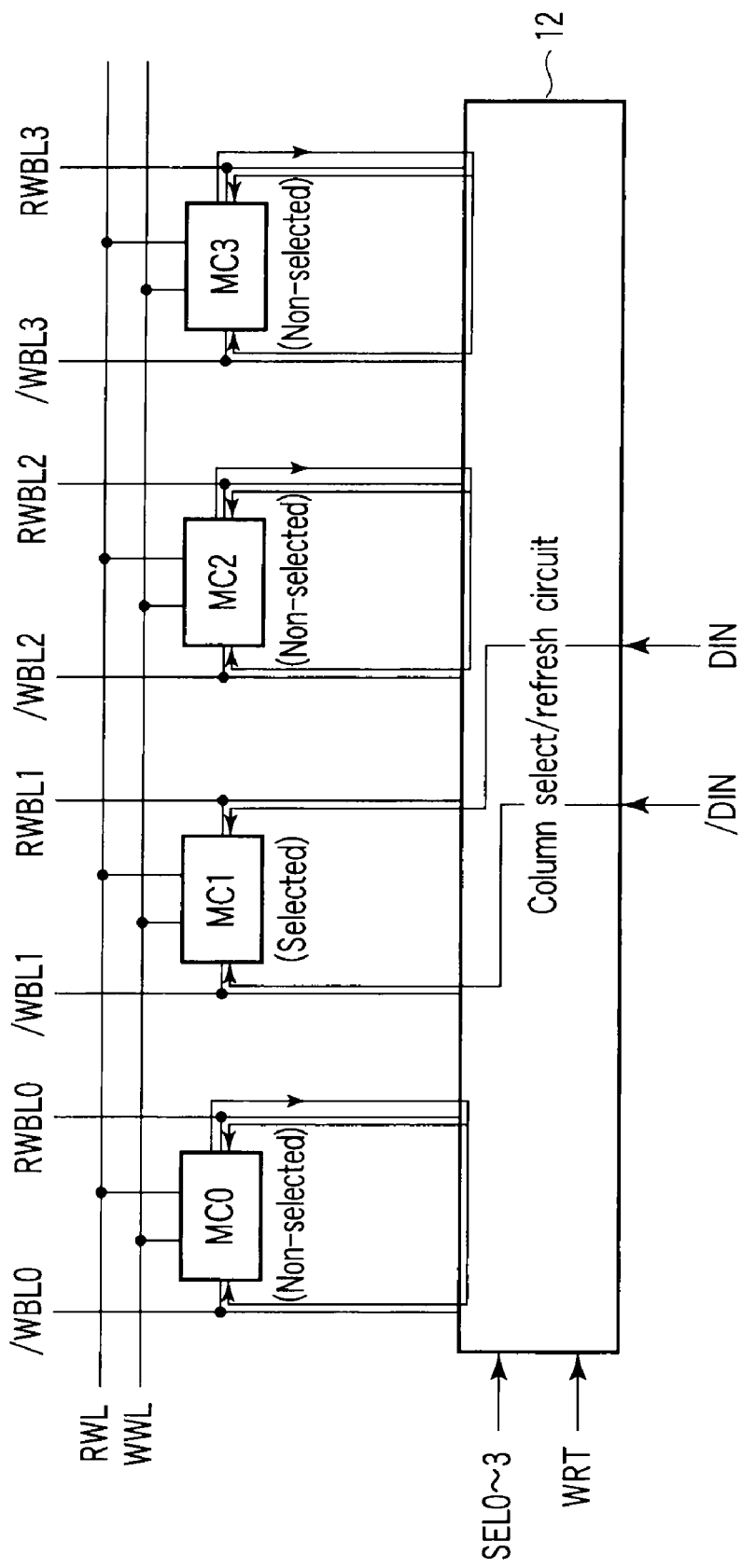
FIG. 9 is a diagram illustrating flow of data when data is written in the second embodiment.
Figure 10:
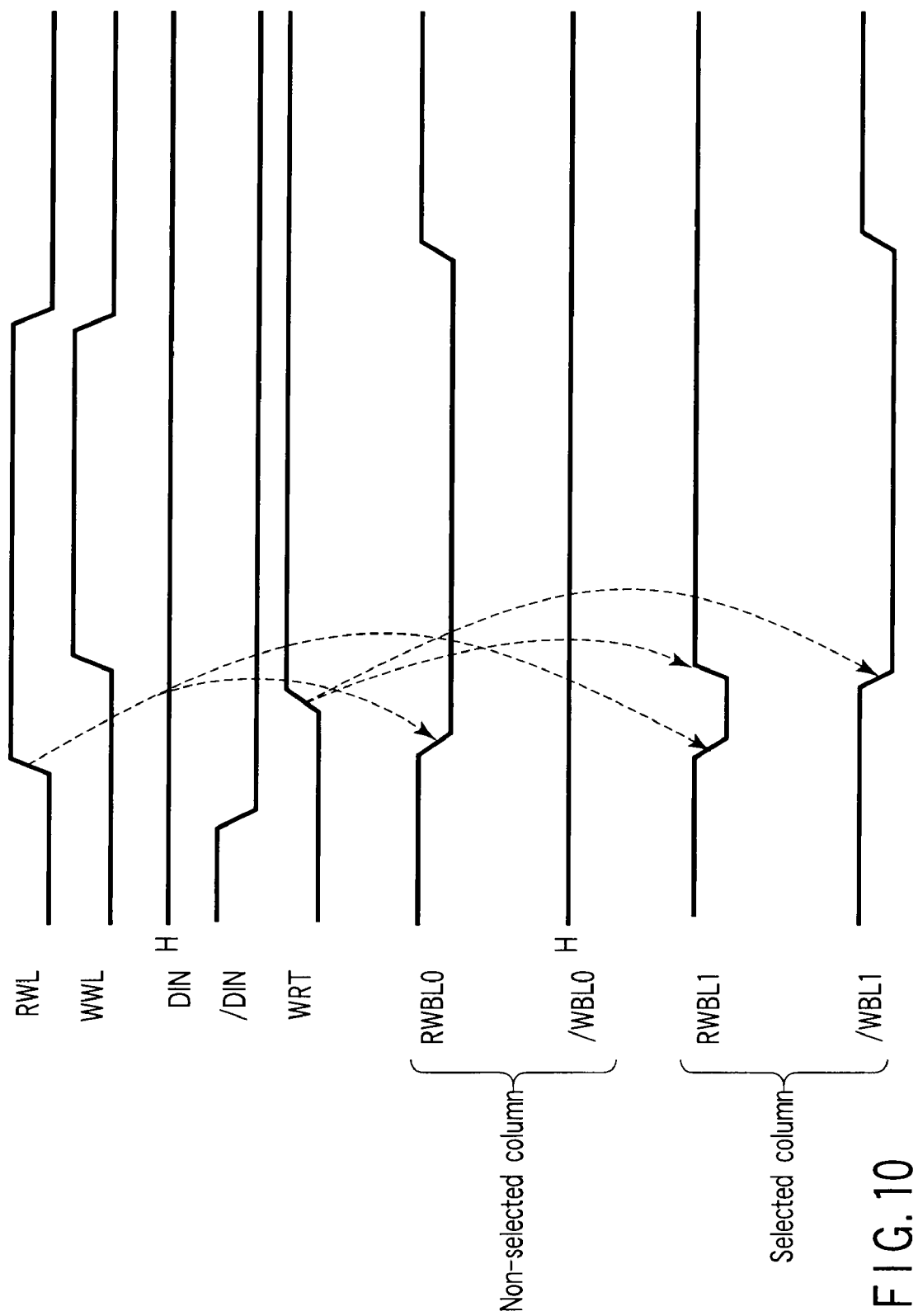
FIG. 10 is a timing chart of the SRAM when data is written in the second embodiment.

The following is an explanation of operation of the SRAM. FIG. 9 is a diagram illustrating flow of data when data is written. FIG. 10 is a timing chart of the SRAM when data is written. As illustrated in FIG. 9, explained is the case where column 1 including the memory cell MC1 is selected, and the other columns (columns 0, 2 and 3) are not selected. FIG. 10 illustrates a timing chart for the selected column (column 1) and a non-selected column (column 0). For example, the input data item DIN is data "1", and the input data item /DIN is data "0". Suppose that data "1" is stored in the storage node N1 of the non-selected memory cell MC0, and data "0" is stored in the storage node N2 of the non-selected memory cell MC0.

In the second embodiment, since the read/write bit line RWBL functions as a read bit line and a write bit line, cell data read to the read/write bit line RWBL is overwritten with the input data DIN and /DIN in the selected memory cell. Further, in the non-selected memory cells, cell data read to the read/write bit line RWBL are latched by the column select/refresh circuit 12, and the latched data are written again in the memory cells.

Specifically, in data writing, first, the read word line RWL is made high, and cell data are read to the read/write bit lines RWBL for all of the selected/non-selected columns. Next, the write signal WRT is made high, and input data items DIN and /DIN are transferred to the read/write bit line RWBL1 and the write bit line /WBL1, respectively, of the selected column. On the other hand, the cell data read to the read/write bit line RWBL is transferred to the read/write bit line RWBL and the write bit line /WBL of each of the non-selected columns.

Then, when the write word line WWL is made high, the data of the read/write bit line RWBL and the write bit line /WBL are written to the memory cells MC, in all of the selected/non-selected columns. Specifically, in the selected column, the input data items DIN and /DIN are written to the memory cell MC1. On the other hand, in the non-selected columns, data stored in the memory cell MC are written again.

As detailed above, according to the second embodiment, the read bit line RBL and the write bit line WBL is combined into a read/write bit line RWBL, and thus the number of bit lines for each memory cell can be reduced from 3 to 2, in comparison with the first embodiment. This enables reduction in the cell area, and reduction in the bit line capacity by ease of the pitch of bit lines. The other effects are the same as those of the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells each including a first inverter and a second inverter, a first storage node connected to an output terminal of the first inverter and an input terminal of the second inverter, and a second storage node connected to an input terminal of the first inverter and an output terminal of the second inverter;
   a word line connected to the memory cells; and
   a plurality of bit lines connected to the memory cells, respectively,
   wherein input data is written to a selected memory cell, and data read from an non-selected memory cell is written again to the non-selected memory cell in write operation.

2. The device according to claim 1, wherein
   the word line includes a write word line and a read word line,
   each of the bit lines includes a first write bit line, a second write bit line and a read bit line, and
   each of the memory cells includes:
   a first transfer gate which is connected between the first storage node and the first write bit line, and has a gate connected to the write word line;
   a second transfer gate which is connected between the second storage node and the second write bit line, and has a gate connected to the write word line;
   a drive transistor which has a gate connected to the first storage node, and a source connected to a power supply; and
   a third transfer gate which is connected between a drain of the drive transistor and the read bit line, and has a gate connected to the read word line.

3. The device according to claim 2, further comprising:
   a refresh circuit which transfers the input data to a write bit line connected to the selected memory cell, and transfers the data read from the non-selected memory cell to a write bit line connected to the non-selected memory cell in the write operation.

4. The device according to claim 3, wherein
   the write word line and the read word line are activated in the write operation.

5. The device according to claim 4, wherein
   the read bit line receives data stored in the corresponding memory cell, by activation of the read word line in the write operation.

6. The device according to claim 3, wherein
   the refresh circuit receives a column select signal, and selects one memory cell based on the column select signal.

7. The device according to claim 3, wherein
the refresh circuit receives a write signal, and performs data transfer operation when the write signal is activated.

8. The device according to claim 1, wherein
each of the first inverter and the second inverter includes a load transistor and a drive transistor which are connected in series between a power supply terminal and a ground terminal,
the load transistor is formed of a P-type transistor, and
the drive transistor is formed of an N-type transistor.

9. The device according to claim 1, wherein
the word line includes a write word line and a read word line,
each of the bit lines includes a first bit line and a second bit line, and
each of the memory cells includes:
a first transfer gate which is connected between the first storage node and the first bit line, and has a gate connected to the write word line;
a second transfer gate which is connected between the second storage node and the second bit line, and has a gate connected to the write word line;
a drive transistor which has a gate connected to the first storage node, and a source connected to a power supply; and
a third transfer gate which is connected between a drain of the drive transistor and the second bit line, and has a gate connected to the read word line.

10. The device according to claim 9, further comprising:
a refresh circuit which transfers the input data to a bit line connected to the selected memory cell, and transfers the data read from the non-selected memory cell to a bit line connected to the non-selected memory cell in the write operation.

11. The device according to claim 10, wherein
the write word line and the read word line are activated in the write operation.

12. The device according to claim 11, wherein
the second bit line receives data stored in the corresponding memory cell, by activation of the read word line in the write operation.

13. The device according to claim 10, wherein
the refresh circuit receives a column select signal, and selects one memory cell based on the column select signal.

14. The device according to claim 10, wherein
the refresh circuit receives a write signal, and performs data transfer operation when the write signal is activated.

15. A control method of a semiconductor memory device, the device comprising:
a plurality of memory cells each including a first inverter and a second inverter, a first storage node connected to an output terminal of the first inverter and an input terminal of the second inverter, and a second storage node connected to an input terminal of the first inverter and an output terminal of the second inverter;
a write word line and a read word line connected to the memory cells; and
a plurality of first write bit lines, a plurality of second write bit lines and a plurality of read bit lines connected to the memory cells, respectively,
each of the memory cells including:
a first transfer gate which is connected between the first storage node and the corresponding first write bit line, and has a gate connected to the write word line;
a second transfer gate which is connected between the second storage node and the corresponding second write bit line, and has a gate connected to the write word line;
a drive transistor which has a gate connected to the first storage node, and a source connected to a power supply; and
a third transfer gate which is connected between a drain of the drive transistor and the corresponding read bit line, and has a gate connected to the read word line,
the method comprising:
writing input data to a selected memory cell in write operation; and
writing again data stored in a non-selected memory cell to the non-selected memory cell in the write operation.

16. The method according to claim 15, wherein
the writing the input data includes:
transferring the input data to a write bit line connected to the selected memory cell; and
activating the write word line, and
the writing again includes:
activating the read word line;
transferring the data read from the non-selected memory cell to a write bit line connected to the non-selected memory cell; and
activating the write word line.

17. The method according to claim 15, further comprising:
activating the read word line in read operation.

18. A control method of a semiconductor memory device, the device comprising:
a plurality of memory cells each including a first inverter and a second inverter, a first storage node connected to an output terminal of the first inverter and an input terminal of the second inverter, and a second storage node connected to an input terminal of the first inverter and an output terminal of the second inverter;
a write word line and a read word line connected to the memory cells; and
a plurality of first bit lines and a plurality of second bit lines connected to the memory cells, respectively,
each of the memory cells including:
a first transfer gate which is connected between the first storage node and the corresponding first bit line, and has a gate connected to the write word line;
a second transfer gate which is connected between the second storage node and the corresponding second bit line, and has a gate connected to the write word line;
a drive transistor which has a gate connected to the first storage node, and a source connected to a power supply; and
a third transfer gate which is connected between a drain of the drive transistor and the corresponding second bit line, and has a gate connected to the read word line,
the method comprising:
writing input data to a selected memory cell in write operation; and
writing again data stored in a non-selected memory cell to the non-selected memory cell in the write operation.

19. The method according to claim 18, wherein
the writing the input data includes:
transferring the input data to a bit line connected to the selected memory cell; and
activating the write word line, and
the writing again includes:
activating the read word line; and
activating the write word line.

20. The method according to claim 18, further comprising:
activating the read word line in read operation.

* * * * *